(12) United States Patent
Rose et al.

(10) Patent No.: US 11,380,672 B2
(45) Date of Patent: *Jul. 5, 2022

(54) METHOD AND DEVICE FOR ELECTRICAL OVERSTRESS AND ELECTROSTATIC DISCHARGE PROTECTION

(71) Applicant: Semtech Corporation, Camarillo, CA (US)

(72) Inventors: David J. Rose, Camarillo, CA (US); William A. Russell, Thousand Oaks, CA (US); Jonathan Clark, Camarillo, CA (US)

(73) Assignee: Semtech Corporation, Camarillo, CA (US)

( * ) Notice: Subject to any disclaimer, the term of this patent is extended or adjusted under 35 U.S.C. 154(b) by 132 days.

This patent is subject to a terminal disclaimer.

(21) Appl. No.: 16/878,863

(22) Filed: May 20, 2020

(65) Prior Publication Data

US 2020/0286884 A1 Sep. 10, 2020

Related U.S. Application Data (63) Continuation of application No. 15/925,569, filed on Mar. 19, 2018, now Pat. No. 10,692,854.

(Continued)

(51) Int. Cl.
*H01L 27/02* (2006.01)
*H02H 9/04* (2006.01)
(Continued)

(52) U.S. Cl.
CPC .......... *H01L 27/0266* (2013.01); *H01C 7/12* (2013.01); *H01L 23/62* (2013.01);
(Continued)

(58) Field of Classification Search
CPC . H01L 23/62; H01L 27/0266; H01L 27/0255; H01L 29/861; H02H 9/046; H02H 9/041; H02H 9/026; H01C 7/12
(Continued)

(56) References Cited

U.S. PATENT DOCUMENTS

| 4,533,970 A | 8/1985 | Brown |
|---|---|---|
| 4,744,369 A | 5/1988 | Kroll |

(Continued)

FOREIGN PATENT DOCUMENTS

| EP | 0461054 A1 | 12/1991 |
|---|---|---|
| KR | 20100048926 A | 5/2010 |

(Continued)

OTHER PUBLICATIONS

Eaton Bussman Series, Technical Note, "ESD Protection of high-speed data lines", pp. 1-2, Dec. 2017.

(Continued)

*Primary Examiner* — Kevin J Comber
(74) *Attorney, Agent, or Firm* — Brian M. Kaufman; Robert D. Atkins; Patent Law Group: Atkins and Associates, P.C.

(57) ABSTRACT

A semiconductor device is protected from electrical overstress (EOS) and electro-static discharge (ESD) events by a series protection circuit electrically coupled in series along the transmission line between a signal source and a load. The series protection circuit includes a first field-effect transistor (FET) electrically coupled in series between the signal source and load. A parallel protection circuit is electrically coupled between the transmission line and a ground node. The parallel protection circuit can include a transient-voltage-suppression (TVS) diode.

20 Claims, 8 Drawing Sheets

Related U.S. Application Data (60) Provisional application No. 62/477,959, filed on Mar. 28, 2017.

(51) Int. Cl.
  *H01L 29/861* (2006.01)
  *H01C 7/12* (2006.01)
  *H01L 23/62* (2006.01)
  *H02H 9/02* (2006.01)

(52) U.S. Cl.
  CPC ........ *H01L 27/0255* (2013.01); *H01L 29/861* (2013.01); *H02H 9/025* (2013.01); *H02H 9/041* (2013.01); *H02H 9/046* (2013.01)

(58) Field of Classification Search
  USPC .......................................................... 361/56
  See application file for complete search history.

(56) References Cited

U.S. PATENT DOCUMENTS

| | | |
|---|---|---|
| 5,196,980 A | 3/1993 | Carson |
| 5,545,909 A | 8/1996 | Williams et al. |
| 5,696,659 A | 12/1997 | Maruo |
| 5,729,418 A | 3/1998 | Lei |
| 5,742,463 A | 4/1998 | Harris |
| 5,761,019 A | 6/1998 | Kroll |
| 6,002,566 A | 12/1999 | Arikawa et al. |
| 6,714,393 B2 | 3/2004 | Nostrand |
| 6,744,883 B1 | 6/2004 | Bingel et al. |
| 6,970,337 B2 | 11/2005 | Strahm |
| 7,262,946 B2 | 8/2007 | Harris et al. |
| 7,324,315 B2 | 1/2008 | Harris |
| 7,342,433 B2 | 3/2008 | Harris et al. |
| 7,457,093 B2 | 11/2008 | Harris |
| 7,492,566 B2 | 2/2009 | Harris |
| 7,576,962 B2 | 8/2009 | Harris |
| 7,593,204 B1 | 9/2009 | Iversen et al. |
| 7,646,576 B2 | 1/2010 | Harris et al. |
| 10,181,719 B2 | 1/2019 | Coyne |
| 2006/0158816 A1 | 7/2006 | Harris |
| 2008/0192394 A1* | 8/2008 | Harris .................... H02H 9/025 361/56 |
| 2009/0207542 A1 | 8/2009 | Carcouet et al. |
| 2010/0110595 A1 | 5/2010 | Yang et al. |
| 2010/0277847 A1* | 11/2010 | Li .......................... H02H 3/087 361/111 |
| 2012/0194953 A1* | 8/2012 | Mikolajczak .......... H02H 9/046 361/56 |
| 2013/0215808 A1 | 8/2013 | Muthukrishnan et al. |
| 2015/0214732 A1 | 7/2015 | Haruki et al. |
| 2016/0276827 A1 | 9/2016 | Coyne |
| 2017/0170824 A1* | 6/2017 | Du .......................... H03K 17/94 |
| 2018/0286854 A1 | 10/2018 | Rose et al. |

FOREIGN PATENT DOCUMENTS

| | | |
|---|---|---|
| WO | 9501667 | 1/1995 |
| WO | 2005020402 | 3/2005 |
| WO | 2006050568 A1 | 5/2006 |

OTHER PUBLICATIONS

Vishay General Semiconductors, Diodes and Rectifiers, "High Speed Data Line Protection", pp. 1-3, Nov. 15, 2016.
Texas Instruments, Application Report SLVA785, "Picking ESD Diodes for Ultra High-Speed Data Lines", pp. 1-7, Jun. 2016.

* cited by examiner

METHOD AND DEVICE FOR ELECTRICAL OVERSTRESS AND ELECTROSTATIC DISCHARGE PROTECTION

CLAIM TO DOMESTIC PRIORITY

The present application is a continuation of U.S. patent application Ser. No. 15/925,569, now U.S. Pat. No. 10,692,854, filed Mar. 19, 2018, which claims the benefit of U.S. Provisional Application No. 62/477,959, filed Mar. 28, 2017, which applications are incorporated herein by reference.

FIELD OF THE INVENTION

The present invention relates in general to semiconductor devices and, more particularly, to a semiconductor device and method of protecting a device from electrical overstress (EOS) and electrostatic discharge (ESD) events.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), small signal transistor, resistor, capacitor, inductor, or power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Figure 1:
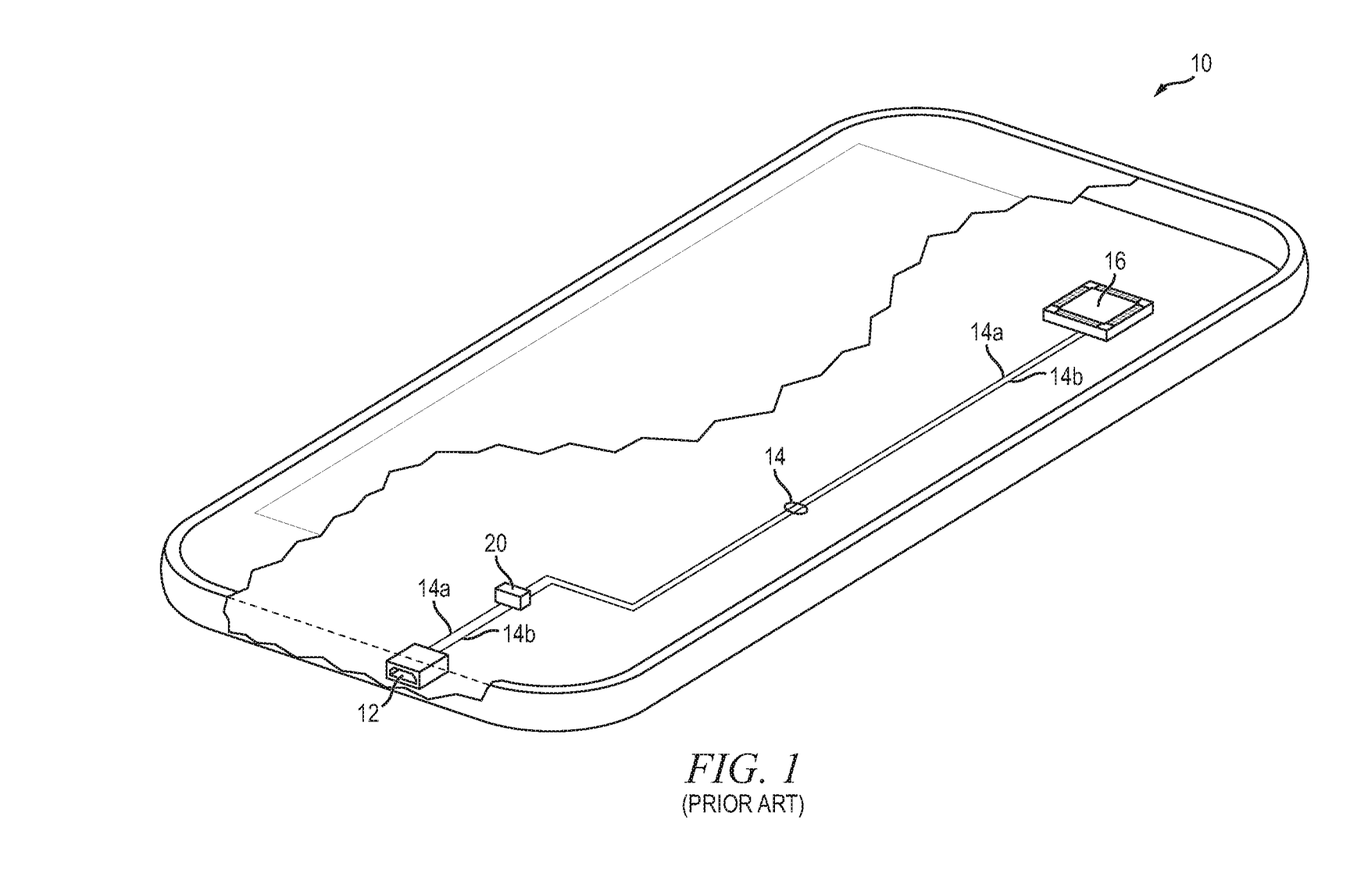
FIG. 1 illustrates using a TVS diode as a parallel protection circuit.

Transient-voltage-suppression (TVS) diodes are commonly used to protect semiconductor devices from electrostatic discharge (ESD). A TVS diode can be coupled in parallel with a load to shunt transient voltage spikes away from the load, typically to ground. FIG. 1 illustrates one example with regard to a mobile device 10 having a Universal Serial Bus (USB) port 12. A data line 14a and ground line 14b are routed on a printed circuit board (PCB) from USB port 12 to a microprocessor (CPU), USB controller, or other semiconductor device 16. Data line 14a allows high-speed transfer of data between CPU 16 and an external device connected to USB port 12. A ground line 14b is routed from USB port 12 to CPU 16 so that the external device and mobile device 10 are operating on the same ground voltage potential.

TVS diode 20 is coupled from data line 14a to ground line 14b to protect CPU 16 from electrical overstress (EOS) and ESD events on data line 14a. TVS diode 20 is approximately an open circuit at normal voltage levels for data line 14a. However, the resistance of electrical current through TVS diode 20 is substantially reduced when the voltage potential of data line 14a increases over a breakdown voltage of the TVS diode. Excess electrical current from ESD or EOS events on data line 14a flows through TVS diode 20 to ground line 14b, which helps keep the voltage potential at data line 14a within safe levels for the interconnect terminal of CPU 16.

One problem with TVS diodes for ESD and EOS suppression is that TVS diodes have a junction capacitance that is proportional to the current handling capability of the TVS diode. When used to protect high-speed data lines, a low capacitance is generally desired to reduce adverse effects of the junction capacitance on signal integrity. One method of reducing apparent capacitance of the TVS device is to integrate steering diodes in a bridge configuration. A TVS device including steering diodes has a reduced capacitance, allowing the TVS device to be better suited for high frequency data lines, but then the TVS device is of limited use for EOS protection due to lower current handling capability. Low capacitance to ground and high current surge capability remain difficult to achieve together.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

While the invention is described in terms of a USB port on a mobile device, the described electrical over-stress (EOS) and electrostatic discharge (ESD) protection method and device is usable with any suitable data line, e.g., Ethernet, HDMI, DVI, SATA, etc. The described EOS and ESD protection is also useable with power lines, analog audio lines, radio frequency (RF) lines, and any other conductor that transmits an electrical signal. The device could be a cell phone as illustrated, any other device with a USB or other data port, an expansion card for insertion into a personal computer, a dedicated media player, or any other electronic device.

Figure 2A:
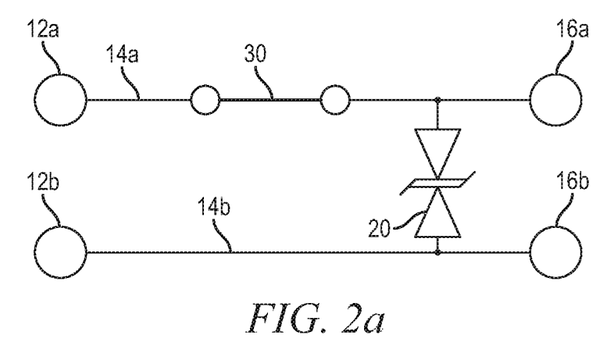
FIGS. 2a-2c illustrate a series protection circuit used in combination with the TVS diode.
Figure 2B:
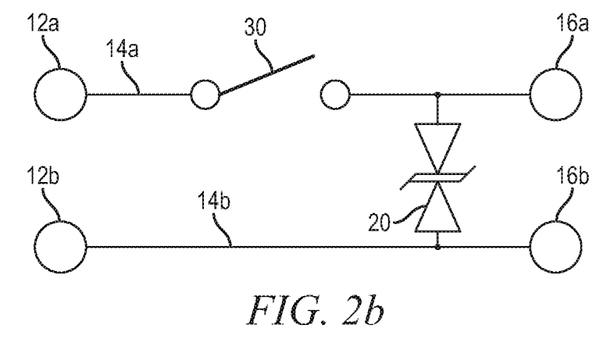
Figure 2C:
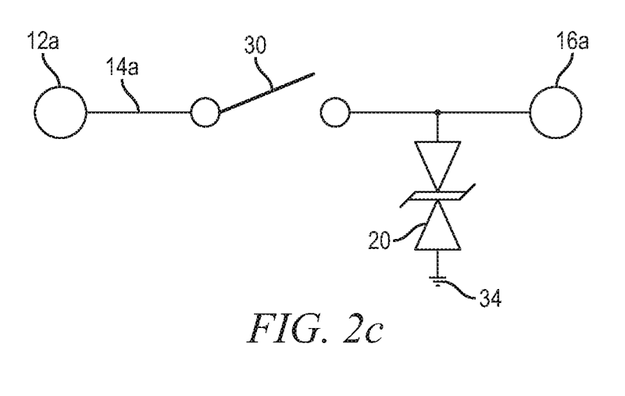

FIGS. 2a-2c illustrate utilizing a series protection circuit 30 in combination with TVS diode 20, which is used as a parallel protection circuit. Interconnect terminals 12a and 12b represent physical conductors of USB port 12 connected to data line 14a and ground line 14b, respectively. Interconnect terminals 16a and 16b represent physical conductors, e.g., pins or leads, of CPU 16 that are connected to data line 14a and ground line 14b opposite USB port 12. Series protection circuit 30 is referred to as "series" because a signal on data line 14a, also referred to as a transmission line, flows through the series protection circuit serially between interconnect terminals 12a and 16a. TVS diode 20 is referred to as a "parallel" protection circuit because the parallel protection circuit is coupled between data line 14a and ground line 14b in parallel with CPU 16 or, another load being protected. In other embodiments, parallel protection circuits other than TVS diodes are used.

Series protection circuit 30 operates similarly to a switch. FIG. 2a illustrates the switch of series protection circuit 30 closed, while FIG. 2b illustrates the switch open. During normal operation of mobile device 10, series protection circuit 30 is like the closed switch of FIG. 2a, allowing a signal on data line 14a to flow to interconnect terminal 16a and be received by CPU 16. TVS diode 20 is a substantially open circuit, and provides a relatively low capacitance to ground line 14b, helping to preserve signal integrity.

During an ESD event, TVS diode 20 has a significantly reduced electrical resistance to shunt ESD current to ground line 14b, clamping the voltage potential at interconnect terminal 16a to a safe level for CPU 16. TVS diode 20 can be a silicon avalanche pn-junction diode without snap-back, or a device with shallow or deep snap-back characteristics. TVS diode 20 may or may not include steering diodes to further reduce junction capacitance.

ESD events occur relatively quickly and last for a relatively short period, e.g., only a few nanoseconds. In many embodiments, series protection circuit 30 is not fast enough to guarantee sufficient protection of a load, thus the use of TVS diode 20 in combination with the series protection circuit helps protect from ESD events when series protection circuit 30 is insufficient.

During an EOS event, series protection circuit 30 activates and enters a high impedance state, approximating an open switch as shown in FIG. 2b. The load connected to interconnect terminal 16a, e.g., CPU 16, is effectively electrically isolated from the EOS source at interconnect terminal 12a. EOS events are generally of longer duration than ESD events, e.g., several microseconds, and TVS diode 20 may not be rated to handle the excess EOS current for the extended period. Thus, series protection circuit 30 helps avoid damage to TVS diode 20 during EOS events. Series protection circuit 30 is designed to withstand the maximum expected open circuit EOS voltage. The supplemental protection from series protection circuit 30 allows a TVS diode 20 to be used having a lower power handling capability, and thus lower size and lower capacitance to ground, than without the series protection circuit 30. Series protection circuit 30 reduces the maximum power absorbed by parallel protection circuit 20 by increasing resistance on data line 14a during EOS events.

FIG. 2c illustrates an embodiment with parallel protection circuit 20 coupled to a ground node 34 rather than ground line 14b. In some embodiments, there is not necessarily a specific ground trace routed from a signal source to a signal destination. Parallel protection circuit 20 can be configured to dump excess energy from ESD events to any suitable ground node. Ground node 34 can be a ground plane within a PCB of mobile device 10, or any other ground reference circuit node of either mobile device 10 or the device coupled to USB port 12.

Figure 3:
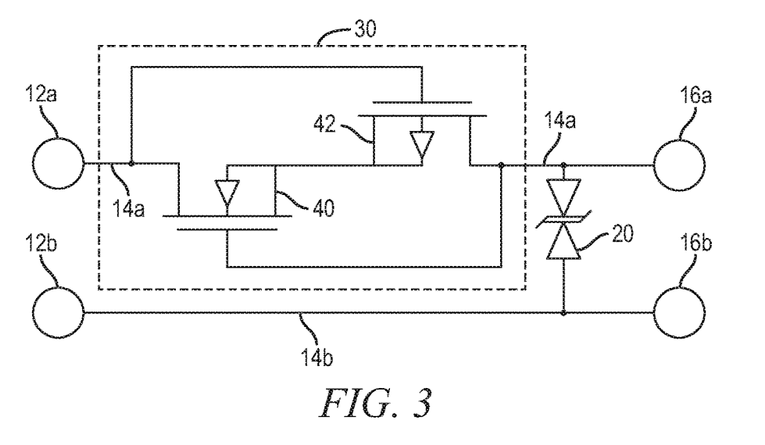
FIG. 3 illustrates an implementation of the series protection circuit as a voltage blocking circuit.

FIG. 3 illustrates one implementation of series protection circuit 30 that utilizes voltage blocking with field-effect transistors (FETs). Series protection circuit 30 is formed from N-channel depletion mode MOSFET (NMOS) 40 and P-channel depletion mode MOSFET (PMOS) 42. NMOS 40 includes a drain terminal coupled to interconnect terminal 12a at one end of data line 14a, and a gate terminal coupled to interconnect terminal 16a at the other end of the data line. PMOS 42 includes opposite connections, with a gate terminal coupled to interconnect terminal 12a at USB port 12 and a drain terminal coupled to interconnect terminal 16a. A source terminal of NMOS 40 is coupled to a source terminal of PMOS 42. TVS diode 20 remains coupled between interconnect terminal 16a and ground line 14b as a parallel protection circuit.

As electrical current from interconnect terminal 12a to the load at interconnect terminal 16a increases during an EOS event, the voltage potential drop across PMOS 42 increases, which turns off NMOS 40 by reducing the voltage at the gate terminal of the NMOS. Turning off NMOS 40 increases resistance through the NMOS, increasing the voltage potential from drain to source of PMOS 42, and regeneratively turning off the PMOS.

Other types of FETs besides strictly metal-oxide-semiconductor FETs are used in other embodiments. The underlying FET material may be silicon (Si), gallium nitride (GaN), or other semiconducting material. A GaN implementation has advantages of lower capacitance, decreased response time, increased drain-to-source voltage, and lower on-resistance per die area.

Figure 4A:
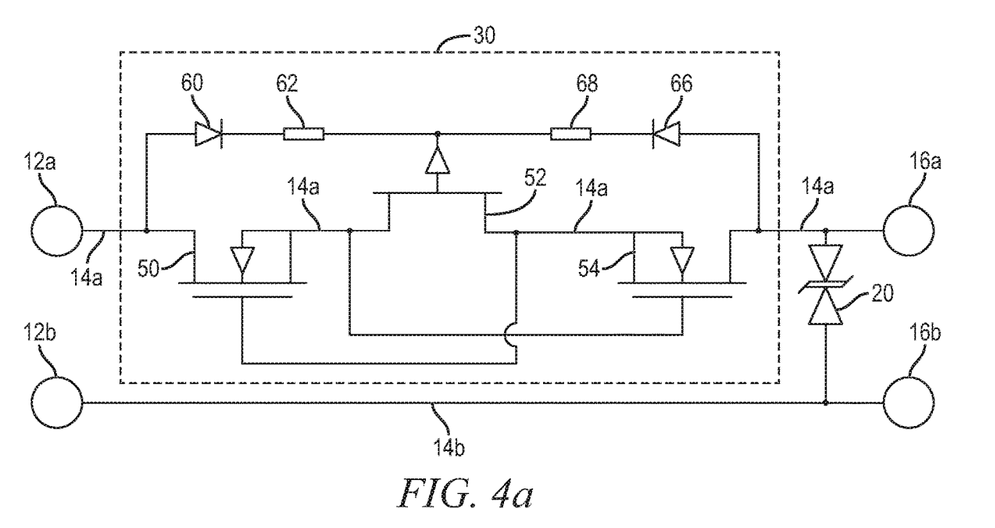
FIGS. 4a and 4b illustrate the series protection circuit as bidirectional voltage blocking circuits.

FIG. 4a illustrates a voltage blocking series protection circuit 30 with bidirectional protection. NMOS 50 includes a drain terminal coupled to interconnect terminal 12a. A source terminal of NMOS 50 is coupled to a first conduction terminal of JFET 52 and a gate terminal of NMOS 54. A gate terminal of NMOS 50 is coupled to a second conduction terminal of JFET 52 and a source terminal of NMOS 54. A drain terminal of NMOS 54 is coupled to interconnect terminal 16a. Steering diode 60 and resistor 62 are coupled in series between interconnect terminal 12a and a gate terminal of JFET 52. Steering diode 66 and resistor 68 are coupled in series between interconnect terminal 16a and the gate terminal of JFET 52. JFET 52 is a junction-gate field-effect transistor or a similar device. TVS diode 20 remains coupled between interconnect terminal 16a and ground line 14b as a parallel protection circuit.

Series protection circuit 30 in FIG. 4a substantially blocks EOS events at interconnect terminal 12a from reaching interconnect terminal 16a whether the EOS event is a positive or negative voltage potential. Series protection circuit 30 in FIG. 4a also substantially block EOS events at interconnect terminal 16a from reaching interconnect terminal 12a. If voltage at one of interconnect terminal 12a or interconnect terminal 16a becomes significantly higher than the other, electrical resistance through JFET 52 is increased by an increase in gate voltage. The resultant increased voltage drop across JFET 52 turns off NMOS 50 and 54.

Steering diodes 60 and 66 allow both interconnect terminal 12a and interconnect terminal 16a to be coupled to the gate of JFET 52 without creating a short-circuit circumventing series protection circuit 30. When interconnect terminal 16a has a higher voltage potential, diode 60 allows the higher voltage potential to propagate to the gate of JFET 52, but diode 66 blocks the higher voltage potential from propagating to interconnect terminal 16a. When interconnect terminal 12a has the lower voltage potential, diode 66 allows current to flow from interconnect terminal 16a to the gate of JFET 52, while diode 60 blocks the current from reaching interconnect terminal 12a. Steering diodes 60 and 66 and resistors 62 and 68 also help control the FET response time.

Figure 4B:
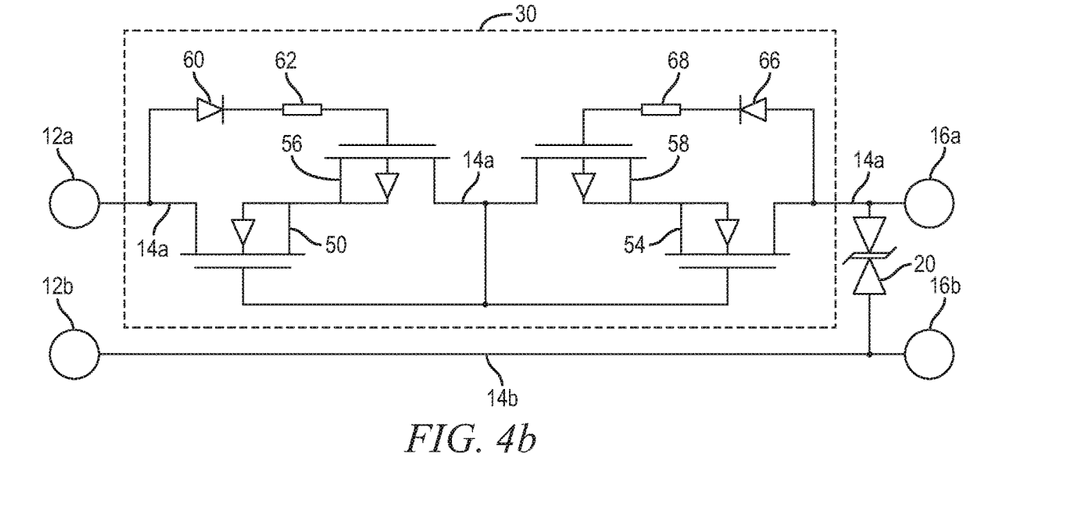

FIG. 4b illustrates the bidirectional voltage blocking circuit from FIG. 4a with JFET 52 replaced by a pair of MOSFETs 56-58. NMOS 50 and PMOS 56 operate as a pair to block EOS events at interconnect terminal 12a from reaching interconnect terminal 16a, similarly to NMOS 40 and PMOS 42 in FIG. 3. PMOS 58 and NMOS 54 operate as a pair to block EOS events at interconnect terminal 16a from reaching interconnect terminal 12a, or negative voltage EOS events at interconnect terminal 12a from reaching interconnect terminal 16a, again similarly to NMOS 40 and PMOS 42 from FIG. 3. PMOS 58 and NMOS 54 are in a mirrored configuration relative to NMOS 50 and PMOS 56. Diode 60, resistor 62, diode 66, and resistor 68 are optional because the two ends of series protection circuit 30 are not coupled to a gate of a common FET. However, the resistors and diodes 60-68 still help configure response time, and could be added to the embodiment in FIG. 3 as well.

Figure 5:
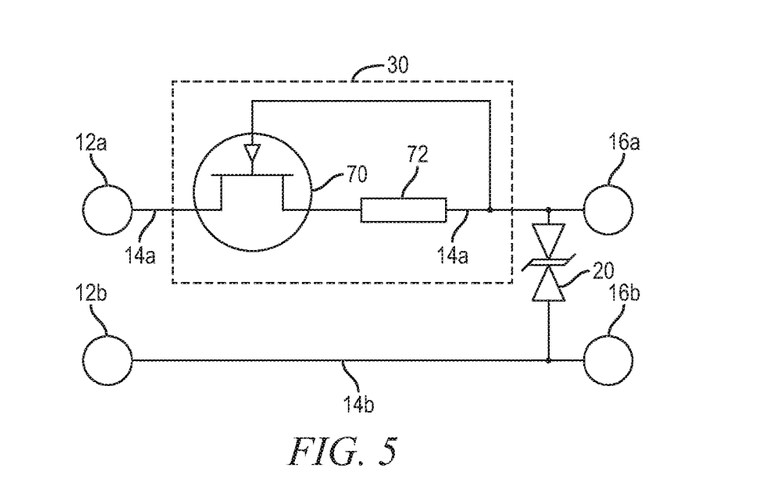
FIG. 5 illustrates an implementation of the series protection circuit as a current blocking circuit.

FIG. 5 illustrates an embodiment of series protection circuit 30 that utilizes current blocking. A two-terminal series protection circuit 30 is represented by JFET 70 and resistor 72 coupled in series between interconnect terminal 12a and interconnect terminal 16a. A gate terminal of JFET 70 is coupled to interconnect terminal 16a on an opposite side of resistor 72 from the JFET. JFET 70 is a junction gate field-effect transistor or similar device. JFET 70 includes semiconductor material that forms a channel in either P-type or N-type silicon with ohmic connections at both ends. JFET 70 may include Si, GaN, or another appropriate semiconductor material. TVS diode 20 remains coupled between interconnect terminal 16a and ground line 14b as a parallel protection circuit.

For an n-channel JFET 70, P-type material is diffused alongside the N-type channel, forming a reversed biased pn-junction. The reversed biased pn-junction results in a depletion region near the channel. During an EOS event, the increased current through series protection circuit 30 increases the voltage potential gradient across resistor 72. The reduced gate voltage of JFET 70 increases the effective width of the depletion region, thus increasing resistance through the channel of the JFET. Once the channel is "pinched off", series protection circuit 30 holds the current approximately constant as voltage increases. A resistance value of resistor 72 can be modified to configure the amount of current through series protection circuit 30 required to begin shutting off JFET 70. During an EOS event, TVS diode 20 conducts residual electrical current let through series protection circuit 30 and continues to protect the load from ESD events. Once the surge of the EOS event subsides, series protection circuit 30 returns to a normal operating state.

Figure 6A:
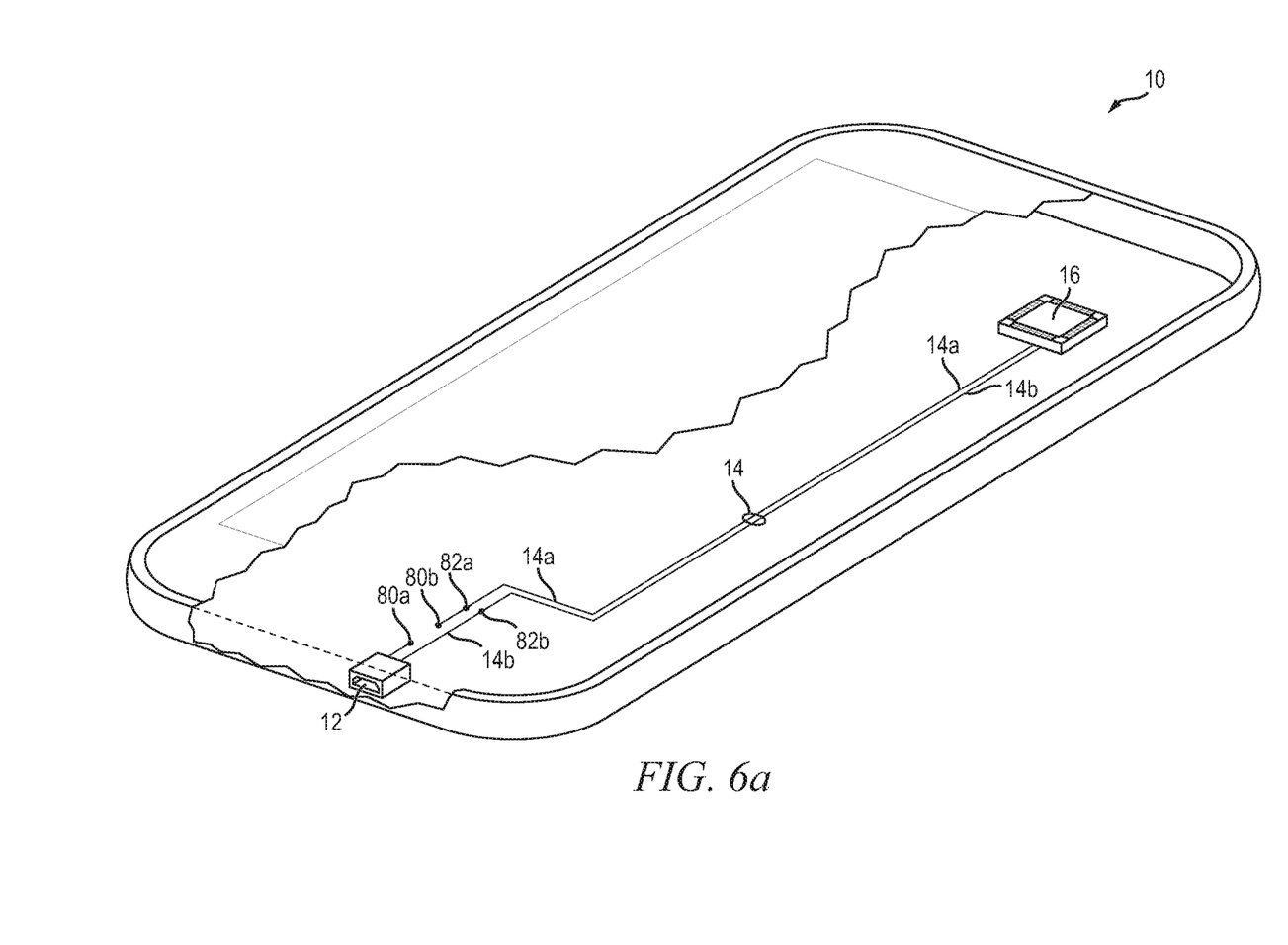
FIGS. 6a and 6b illustrate the series protection circuit and TVS diode used in combination to protect a high speed data line.

FIG. 6a illustrates mobile device 10 with conductive traces 14 configured for mounting of series protection circuit 30 and parallel protection circuit 20. Contact pads 80a and 80b are provided for mounting of series protection circuit 30, and contact pads 82a and 82b are provided for mounting of parallel protection circuit 20. Data line 14a is broken between contact pads 80a and 80b so that all electrical current along the data line is routed through series protection circuit 30.

Figure 6B:
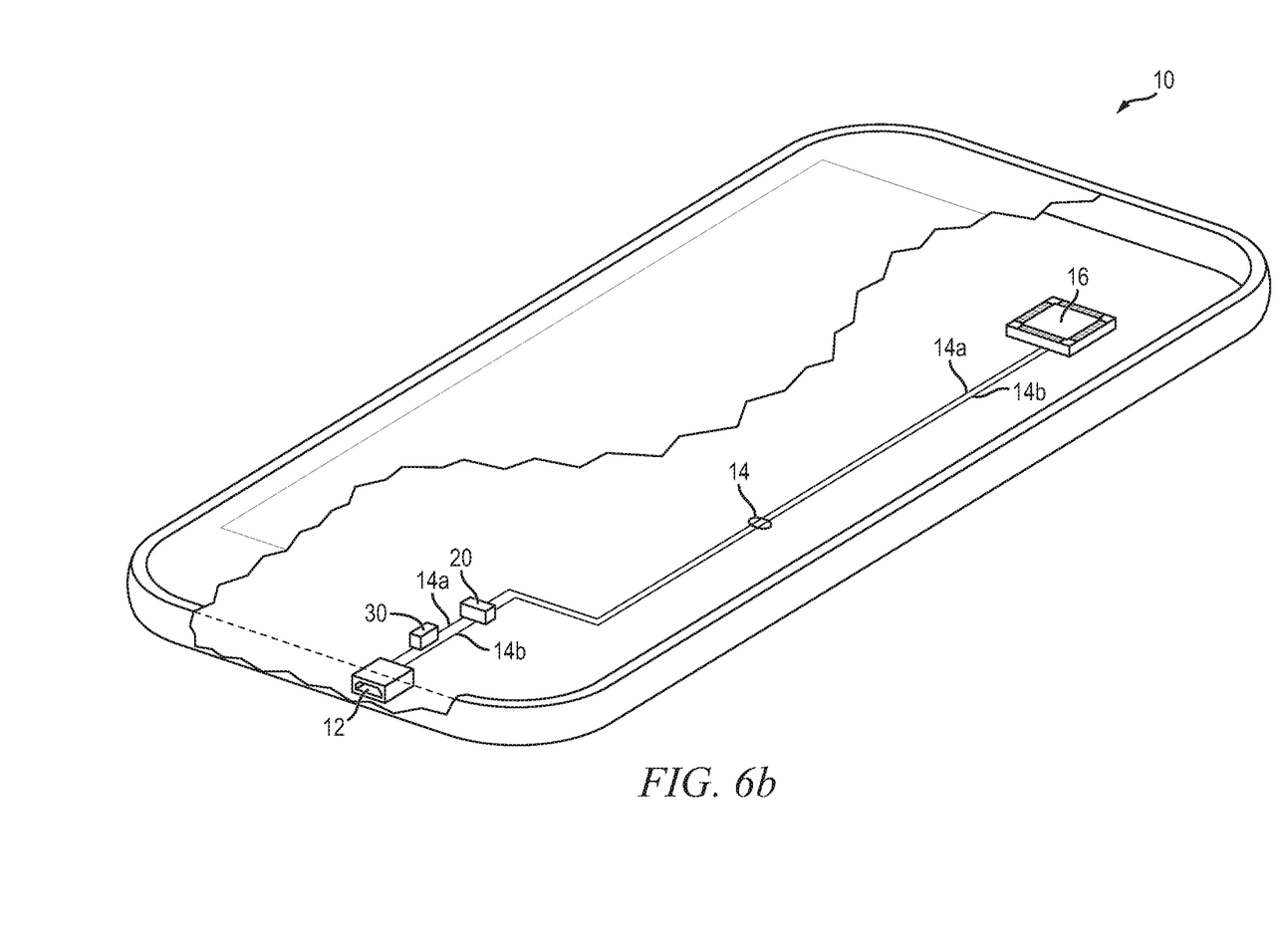

FIG. 6b illustrates series protection circuit 30 and parallel protection circuit 20 mounted onto the PCB of mobile device 10. Each of the protection circuits 20 and 30 are small two-terminal semiconductor packages. Solder bumps or other interconnect structures on the bottom of the protection circuits are reflowed onto contact pads 80 and 82 to mechanically attach and electrically connect the packages to conductive traces 14. Any suitable package type with any suitable interconnection method can be used for series protection circuit 30 and parallel protection circuit 20. Series protection circuit 30 creates an open circuit between USB port 12 and CPU 16 during EOS events with a long duration. The open circuit of series protection circuit 30 protects both CPU 16 and parallel protection circuit 20. During quicker ESD events, parallel protection circuit 20 becomes conductive to dump the excess charge to ground before series protection circuit 30 has time to react.

Figure 7A:
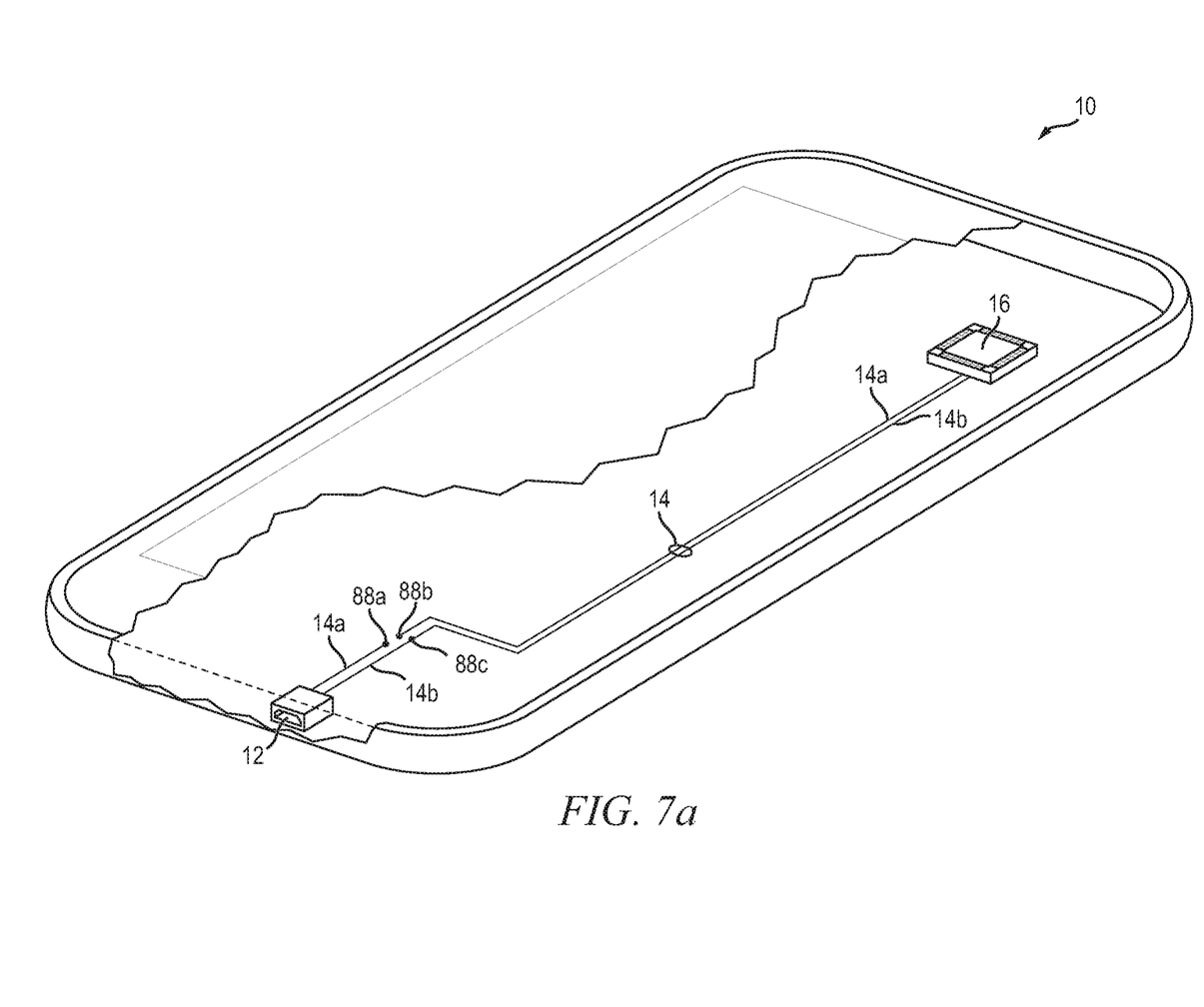
FIGS. 7a and 7b illustrate the series protection circuit and TVS diode in a monolithic package.
Figure 7B:
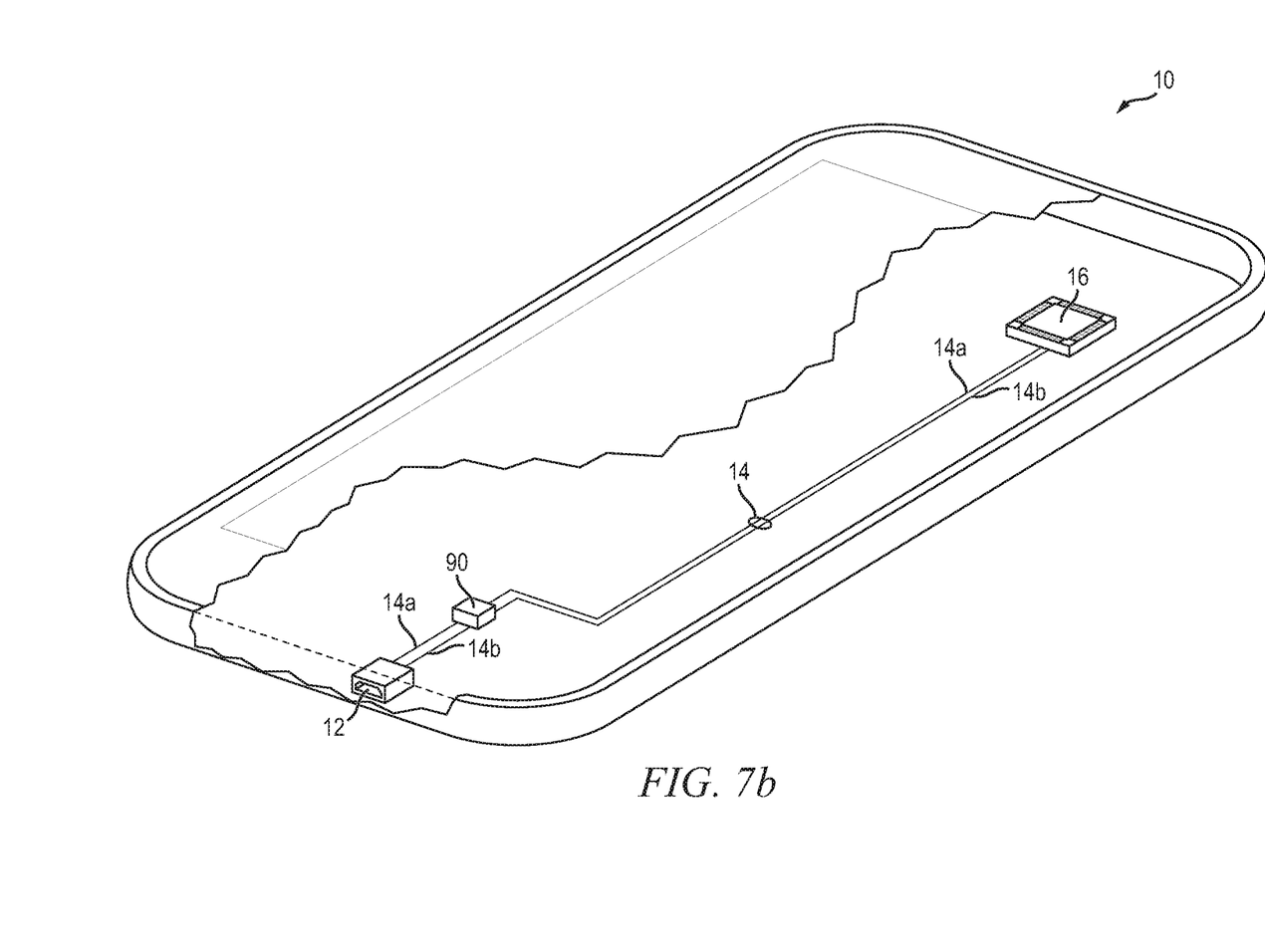

FIG. 7a illustrates mobile device 10 with conductive traces 14 configured for mounting of a monolithic package including both series protection circuit 30 and parallel protection circuit 20. The package is mounted onto contact pads 88a-88c. Internal to the package, series protection circuit 30 routes electrical current between contact pad 88a and contact pad 88b, while parallel protection circuit 20 is coupled between contact pads 88b and 88c. FIG. 7b illustrates monolithic package 90 mounted onto contact pads 88a-88c. Monolithic package 90 can include a single die with both parallel protection circuit 20 and series protection circuit 30 formed on the one die, or multiple dies can be combined in a multi-chip module.

In a monolithic implementation, device characteristics such as reaction time and current handling capability can be matched between parallel protection circuit 20 and series protection circuit 30. Matching the characteristics of parallel protection circuit 20 and series protection circuit 30 helps ensure that neither element is damaged when operated within rated EOS and ESD conditions. That is, monolithic package 90 can be configured to substantially ensure that series protection circuit 30 becomes an open circuit prior to parallel protection circuit 20 reaching the maximum amount of energy the parallel protection circuit can absorb. A monolithic implementation also allows interconnect inductance to be reduced, which reduces clamping voltage during ESD events with relatively fast rise times. The lower clamping voltage reduces the amount of energy absorbed during ESD events.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a transmission line;
   a junction field-effect transistor (JFET) coupled in series with the transmission line, wherein a gate terminal of the JFET is electrically coupled to the transmission line;
   a resistor coupled in series with the transmission line between the JFET and the gate terminal of the JFET, wherein the resistor includes a fixed resistance rating or value; and
   a parallel protection circuit electrically coupled between the transmission line and a ground node.

2. The semiconductor device of claim 1, wherein a conduction terminal of the JFET is directly electrically coupled to a first terminal of the resistor and a gate terminal of the JFET is directly electrically coupled to a second terminal of the resistor.

3. The semiconductor device of claim 1, wherein the JFET and parallel protection circuit are disposed within a single semiconductor package.

4. The semiconductor device of claim 1, wherein the parallel protection circuit includes a transient-voltage-suppression (TVS) diode.

5. The semiconductor device of claim 1, wherein the JFET, resistor, and transmission line are coupled in series between a source and a load.

6. The semiconductor device of claim 1, wherein the gate terminal of the JFET is directly coupled to the parallel protection circuit.

7. A semiconductor device, comprising:
   a junction field-effect transistor (JFET); and
   a resistor comprising a first terminal of the resistor coupled to a conduction terminal of the JFET and a second terminal of the resistor coupled to a gate terminal of the JFET, wherein the resistor includes a fixed resistance rating or value.

8. The semiconductor device of claim 7, wherein the conduction terminal of the JFET is directly electrically coupled to the first terminal of the resistor and the gate terminal of the JFET is directly electrically coupled to the second terminal of the resistor.

9. The semiconductor device of claim 7, wherein the JFET and resistor are coupled in series between a source and a load.

10. The semiconductor device of claim 7, further including a parallel protection circuit coupled to the JFET.

11. The semiconductor device of claim 10, wherein the JFET and parallel protection circuit are within a single semiconductor package.

12. The semiconductor device of claim 10, wherein the parallel protection circuit includes a transient-voltage-suppression (TVS) diode.

13. The semiconductor device of claim 10, wherein the gate terminal of the JFET is directly coupled to the parallel protection circuit.

14. A method of making a semiconductor device, comprising:
   providing a transmission line;
   coupling a junction field-effect transistor (JFET) in series with the transmission line;
   coupling a gate terminal of the JFET to the transmission line; and
   coupling a resistor in series with the transmission line between the JFET and the gate terminal of the JFET, wherein the resistor includes a fixed resistance rating or value.

15. The method of claim 14, wherein a conduction terminal of the JFET is directly electrically coupled to a first terminal of the resistor and the gate terminal of the JFET is directly electrically coupled to a second terminal of the resistor.

16. The method of claim 14, further including coupling the JFET and resistor in series between a source and a load.

17. The method of claim 14, further including coupling a parallel protection circuit to the JFET.

18. The method of claim 17, further including disposing the JFET and parallel protection circuit within a single semiconductor package.

19. The method of claim 17, wherein the parallel protection circuit includes a transient-voltage-suppression (TVS) diode.

20. The method of claim 17, wherein the gate terminal of the JFET is directly coupled to the parallel protection circuit.

* * * * *